(12) United States Patent
Nomoto

(10) Patent No.: US 8,017,431 B2
(45) Date of Patent: Sep. 13, 2011

(54) METHOD FOR MANUFACTURING SEMICONDUCTOR DEVICE

(75) Inventor: Akhiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 294 days.

(21) Appl. No.: 11/620,527

(22) Filed: Jan. 5, 2007

(65) Prior Publication Data

US 2007/0184585 A1 Aug. 9, 2007

(30) Foreign Application Priority Data

Jan. 10, 2006 (JP) ................................. 2006-002009

(51) Int. Cl.
*H01L 51/30* (2006.01)
(52) U.S. Cl. .......... 438/99; 438/149; 438/158; 438/161; 438/759; 257/E51.001; 257/E51.005; 257/E21.007; 257/E21.018; 257/E21.411
(58) Field of Classification Search .................. 438/99, 438/149, 158, 161, 151, 759; 430/17, 200, 430/253, 271.1, 319; 428/409; 427/299, 427/301, 533, 536, 553; 257/E51.001, E21.007, 257/E21.018, E51.005
See application file for complete search history.

(56) References Cited

U.S. PATENT DOCUMENTS

| 6,946,332 | B2 * | 9/2005 | Loo et al. ................ 438/149 |
| 2003/0008224 | A1 * | 1/2003 | Fujita et al. ................ 430/17 |
| 2005/0009327 | A1 * | 1/2005 | Yoshida et al. ............ 438/661 |
| 2005/0163932 | A1 * | 7/2005 | Zschieschang et al. .... 427/258 |

FOREIGN PATENT DOCUMENTS

| JP | HEI 05-067552 | 3/1993 |
| JP | 2002-056980 | 2/2002 |
| JP | 2002-343565 | 11/2002 |
| JP | 2003-241689 | 8/2003 |
| JP | 2005-242323 | 9/2005 |
| JP | 2005-294737 | 10/2005 |

OTHER PUBLICATIONS

Majewski, L. A., "High capacitance organic field-effect transistors with modified gate insulator surface," Journal of Applied Physics, vol. 96, pp. 5781-5787, 2004.

Chabinyc, M.L., "Lamination Method for the Study of Interfaces in Polymeric Thin Film Transistors," Journal of American Chemical Society, vol. 126, pp. 13928-13929, 2004.

* cited by examiner

*Primary Examiner* — A. Sefer
*Assistant Examiner* — Ermias Woldegeorgis
(74) *Attorney, Agent, or Firm* — K&L Gates LLP

(57) ABSTRACT

A method for manufacturing a semiconductor device is provided. The method includes the steps of: (1) coating a solution containing an organic semiconductor material on a water-repellent surface of a water-repellent stamp substrate; (2) drying the thus coated organic semiconductor material-containing solution on the water-repellent surface to crystallize the organic semiconductor material in contact with the water-repellent surface, thereby forming a semiconductor layer; (3) thermally treating the semiconductor layer formed on the stamp substrate; and (4) pressing the stamp substrate at a side, in which the thermally treated organic semiconductor layer is formed, against a surface of a substrate to be transferred so that the organic semiconductor layer is transferred to the surface of the substrate to be transferred.

12 Claims, 8 Drawing Sheets

METHOD FOR MANUFACTURING SEMICONDUCTOR DEVICE

CROSS REFERENCES TO RELATED APPLICATIONS

The present application claims priority to Japanese Patent Application JP 2006-002009 filed in the Japanese Patent Office on Jan. 10, 2006, the entire contents of which is being incorporated herein by reference.

BACKGROUND

The present application relates to the manufacture of a semiconductor device and more particularly, to a method for manufacturing a semiconductor device for forming an organic semiconductor layer by use of a dry stamping method.

Thin film transistors have wide utility as a pixel transistor in electronic circuits, especially in active-matrix, flat panel displays.

At present, most of the thin film transistors are directed to Si-based inorganic semiconductor transistors that make use of amorphous silicon or polysilicon as a semiconductor layer. The manufacture of these transistors makes use of film-forming techniques, such as a chemical vapor deposition (CVD) method. In the method, a vacuum processing chamber is necessary for the formation of a semiconductor layer, thus resulting in high process costs. In addition, thermal treatment at high temperatures is necessary, so that substrates used should have a high heat resistance.

In contrast, with thin film transistors using organic semiconductors, an organic semiconductor layer serving as an active layer can be coated and formed at low temperatures. This is advantageous in cost reduction, and film formation is enabled on a flexible substrate, such as a plastic substrate, which is poor in heat resistance.

A method of manufacturing a bottom gate/bottom contact thin film transistor using such an organic semiconductor as mentioned above is described with reference to FIG. 6. Initially, a gate insulating film 13 is formed over a substrate 11 so as to cover a gate electrode 12 formed on the substrate 11. Next, a source electrode 14 and a drain electrode 15 in pair are formed on the gate insulating film 13. Thereafter, an organic semiconductor layer 20 is formed entirely over the surface of the gate insulating film 13 so as to cover the source electrode 14 and drain electrode 15 therewith, so that a channel layer 21 made of the organic semiconductor layer 20 is formed between the source electrode 14 and the drain electrode 15. The organic semiconductor layer 20 is usually formed according to a spin coating method. A solution containing an organic semiconductor material (i.e. an organic semiconductor ink) is coated and dried.

It has been reported, for example, in Journal of Applied Physics (U.S. A.), 2005, Vol. 96, p. 5781 that with a thin film transistor of such an arrangement as mentioned above, the gate insulating film 13 is subjected to water-repellant treatment on a surface 13a thereof to form a water-repellent layer 16, for which the mobility of the organic semiconductor layer 20 formed on the gate insulating film 13 through the water-repellent layer 16 is improved, thereby increasing an on current.

It has also been reported that the organic semiconductor layer 20 is formed not by a spin coating method, but by a dry stamping method (see, for example, Journal of American Chemical Society (U.S.A.), 2004, Vol. 126, pp. 13928-13929). In this case, as shown in FIG. 7A, the surface of a transfer substrate 40 is subjected to water-repellent treatment with octadecyl trichloro silane (OTS) to form a water-repellent layer 41. It will be noted that the surface of the water-repellent layer 41 is defined as a water-repellent surface 41a of the transfer substrate 40.

Subsequently, an organic semiconductor ink is coated on the water-repellent surface 41a according to a spin coating method and dried to form an organic semiconductor layer 20. The organic semiconductor material is crystallized in contact with the water-repellent surface 41a. It will be noted that a face in contact with the water-repellent surface 41a of the organic semiconductor layer 20 is defined as a contact face 20a. Thereafter, the organic semiconductor layer 20 is thermally treated.

As shown in FIG. 7B, a stamp substrate made of poly dimethyl siloxane (PDMS) is pressed against a side of the transfer substrate 40 where the organic semiconductor layer 20 has been formed, thereby causing the organic semiconductor layer 20 to be transferred to the surface of the stamp substrate 30.

Subsequently, as shown in FIG. 7C, the stamp substrate 30 is, in turn, pressed, at a side where formed with the organic semiconductor layer 20, against the surface 13a of the gate insulating film 13 of the substrate 10 to be transferred on which the source electrode 14 and the drain electrode 15 are formed.

In this manner, as shown in FIG. 7D, the organic semiconductor layer 20 is transferred over the entire region of the surface 13a of the gate insulating film 13, with the result that the channel layer 21 made of the organic semiconductor layer 20 is formed between the source electrode 14 and the drain electrode 15. In this case, the contact face 20a that has been in contact with the water-repellent surface 41a upon crystallization of the organic semiconductor layer 20 is in contact with the surface 13a of the gate insulating film 13.

It is reported in the above-indicated Journal of American Chemical Society that the thin film transistor formed by such a transfer method as set out above works normally as a transistor.

With the thin film transistors reported in such publications as discussed above, however, an on current is not satisfactorily high, and since the organic semiconductor layer 20 is formed on the entire region over the gate insulating film 13, adjacent elements or devices are communicated with each other, with the attendant problem of an off current becomes high. This narrows an on/off ratio of the thin film transistor, thereby degrading electric characteristics.

For lowering an off current, it may occur that an organic semiconductor ink is pattern-printed according to an offset printing technique. With the offset printing, however, a hydrophilic pattern and a water-repellent pattern are, respectively, formed on a surface of a printing plate so that regions where no organic semiconductor ink is deposited are formed. In this connection, chloroform which is typical of a solvent of the organic semiconductor ink is low in boiling point and also in vapor pressure, and immediately after coating of such an organic semiconductor ink, the solvent volatilizes and thus, the organic semiconductor ink becomes thinned. This makes it difficult to form a pattern of the organic semiconductor ink.

SUMMARY

It is desirable to provide a method for manufacturing a semiconductor device that overcomes the disadvantages of the related art. It is also desirable to provide a method for manufacturing a semiconductor device that is able to improve electric characteristics of a semiconductor device of the type using an organic semiconductor layer.

According to a first embodiment, a method for manufacturing a semiconductor device includes first to fourth steps. The first step is to coat a solution containing an organic semiconductor material on a surface of a stamp substrate. The second step is to dry the organic semiconductor material-containing solution coated on the surface of the stamp substrate to crystallize the organic semiconductor material, thereby forming a semiconductor layer. The third step is to thermally treat the semiconductor layer formed on the stamp substrate. The fourth step is to press the stamp substrate at a side of the surface, on which the thermally treated organic semiconductor layer is formed, against a surface of a substrate to be transferred so that the organic semiconductor layer is transferred to the substrate to be transferred.

According to the manufacturing method of the first embodiment, when the organic semiconductor formed on the stamp substrate is thermally treated, oxygen dissolved in the organic semiconductor material-containing solution is removed from the organic semiconductor layer. This enables impurity charges ascribed to oxygen in the organic semiconductor layer to be prevented from remaining in excess, thus lowering conductivity of the organic semiconductor layer. In the second step, the organic semiconductor material is crystallized in contact with a water-repellent surface to form the organic semiconductor layer on the surface of the stamp substrate. This organic semiconductor layer is transferred onto the surface of the substrate to be transferred in the fourth step, under which the contact face with the water-repellent surface of the organic semiconductor layer is at a side opposite to the substrate to be transferred. It has been confirmed that the semiconductor device manufactured according to this method has not only a reduced off current owing to a lowering in conductivity of the organic semiconductor layer, but also an increased on-current and an improved on/off ratio when compared with the case where an organic semiconductor layer is formed according to a spin coating method as will be described in more detail hereinafter.

A method for manufacturing a semiconductor device according to a second embodiment includes first to fourth steps. The first step is to provide a stamp substrate having an indented surface and coating a solution containing an organic semiconductor material onto the indented surface according to an indented pattern thereof. The second step is to dry the organic semiconductor material-containing solution thus coated on the surface of the stamp substrate to crystallize the organic semiconductor material in contact with a water-repellent surface of the stamp substrate, thereby forming an organic semiconductor layer. The third step is to thermally treat the organic semiconductor layer formed on the stamp substrate. The fourth step is to press the stamp substrate at a side of the surface, on which the thermally treated organic semiconductor layer is formed, against a surface of a substrate to be transferred, thereby causing the pattern of the organic semiconductor layer formed at top faces of protrusions to be transferred to the surface of the substrate to be transferred.

According to the second manufacturing method of the semiconductor device, after the crystallization of the organic semiconductor material and the formation of the organic semiconductor layer on the surface of the stamp substrate in the second step, the organic semiconductor layer formed on the stamp substrate is thermally treated in the third step, so that oxygen dissolved in the organic semiconductor material is removed from the organic semiconductor layer. In this way, impurity charges ascribed to oxygen in the organic semiconductor layer are prevented from being left in excess and thus, conductivity of the organic semiconductor layer lowers, thereby reducing the off current. Moreover, since the pattern of the organic semiconductor layer formed at top faces of the protrusions of the stamp substrate is transferred to the surface of the substrate to be transferred which has the source electrode and the drain electrode, so that the channel layer made of the organic semiconductor layer can be patterned in high accuracy between the source electrode and the drain electrode. This prevents mutual communication of the organic semiconductor layers between adjacent devices, which contributes to reduction of the off current. Accordingly, the on/off ratio of the semiconductor device can be increased.

A manufacturing method of a semiconductor device according to a third embodiment includes first to fourth steps. The first step is to coat a solution containing an organic semiconductor material on a surface of a transfer substrate provided with a treated pattern by a surface treatment. The second step is to dry the semiconductor material-containing solution coated onto the surface of the transfer substrate to crystallize the organic semiconductor material in contact with the treated pattern, thereby forming an organic semiconductor layer on the surface of the transfer substrate. The third step is to press the transfer substrate at a side of the surface, on which the organic semiconductor layer is formed against a surface of a stamp substrate which has better adhesion to the organic semiconductor layer than to the treated pattern and has poorer adhesion to the organic semiconductor layer than to the transfer substrate, thereby causing the pattern of the organic semiconductor layer on the treated pattern to be transferred to the surface of the stamp substrate. The fourth step is to press the stamp substrate at a side of the surface, on which the pattern of the organic semiconductor layer is formed, against a surface of a substrate to be transferred to cause the pattern of the semiconductor layer to be transferred to the surface of the substrate to be transferred. The organic semiconductor layer is thermally treated in the course between the second and third steps or between the third and fourth steps.

According to the manufacturing method of the semiconductor device of the third embodiment, since the organic semiconductor layer is thermally treated in the course between the second and third steps or between the third and fourth steps, oxygen dissolved in the solution containing an organic semiconductor material is removed from the organic semiconductor layer. By this, impurity charges caused by the oxygen in the organic semiconductor layer are prevented from being left in excess and thus, conductivity of the organic semiconductor layer lowers, resulting in the reduction of an off current. Moreover, since the organic semiconductor layer of the transfer substrate is transferred to the surface of the stamp substrate that has better adhesion to the organic semiconductor layer than to the water-repellent pattern and has poorer adhesion to the organic semiconductor layer than to the transfer substrate, the organic semiconductor layer on the water-repellent pattern is transferred. The organic semiconductor layer is patterned in high accuracy. Thus, when the pattern of the organic semiconductor layer is transferred to the surface of the substrate to be transferred, which is formed with the source electrode and the drain electrode thereon, the channel layer made of the organic semiconductor layer is accurately patterned between the source and drain electrodes, thus preventing the semiconductor layers from communicating between adjacent devices. This eventually leads to the reduction of an off current. Accordingly, the on/off ratio of the semiconductor device can be increased.

As stated hereinabove, according to the methods of the first to third embodiments, the on/off ratio of the semiconductor device can be increased by increasing an on current or by reducing an off current, so that electric characteristics of the semiconductor device can be improved.

Additional features and advantages are described herein, and will be apparent from, the following Detailed Description and the figures.

DETAILED DESCRIPTION

Embodiments are described in more detail with reference to the accompanying drawings.

An embodiment relating to a manufacturing method of a semiconductor device according to the invention is described based on the sectional views of FIGS. 1A to 1D showing manufacturing steps. An instance of a method of manufacturing a bottom gate/bottom contact, thin film transistor is illustrated.

Figure 1A:
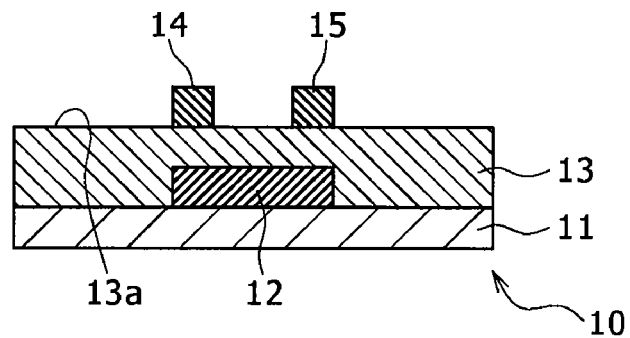
FIGS. 1A to 1D are, respectively, a schematic sectional view showing a manufacturing step illustrating a method for manufacturing a semiconductor device according to a first embodiment.

As shown in FIG. 1A, a substrate 10 is formed as follows. An underlying substrate 11 made, for example, of polyether sulfone (PES) is formed thereon with a gate electrode 12 made of aluminium (Al), for example, by a vacuum deposition method using a mask. Next, a gate insulating film 13 made, for example, of $SiO_2$ is formed on the underlying substrate 11 in a manner as to cover the gate electrode. Thereafter, a source electrode 14 and a drain electrode 15 in pair, each made, for example, of gold (Au) are formed on the gate insulating film 13. With the above substrate 10 to be transferred, a surface 13a of the gate insulating film 13 becomes a face of an organic semiconductor layer to be transferred.

Figure 1B:
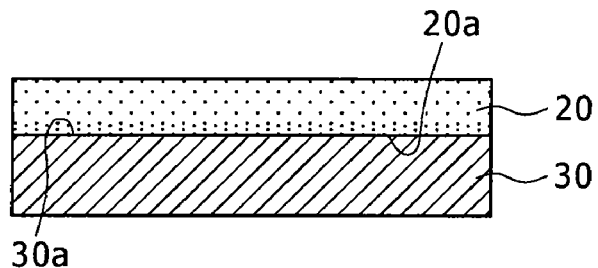

On the other hand, as shown in FIG. 1B, a solution containing an organic semiconductor material (an organic semiconductor ink) is coated over an entire region of a surface (water-repellent face) of a plate-shaped stamp substrate 30 having water repellency and made, for example, of PDMS. The organic semiconductor ink used herein is one which is obtained by dissolving an organic semiconductor material made, for example, of poly-3-hexylthiophene (P3HT) in a chloroform solvent at a concentration of 5 mg/ml. It will be noted that although an instance using P3HT as an organic semiconductor material is illustrated herein, the invention is applicable to the case where other types of organic semiconductor materials, such as a fluorene-dithiophene copolymer (F2T8), are used.

Since chloroform is low in boiling point and high in volatility, chloroform volatilizes immediately after the coating and thus, the organic semiconductor ink is dried to form a thin film. At this stage, the organic semiconductor material is crystallized in a state of contact with the water-repellent face 30a and thus, a semiconductor layer 20 is formed on the water-repellent face 30a. The face of the organic semiconductor layer 20 contacting with the water-repellent face 30a upon the crystallization is defined as a contact face 20a.

Next, the stamp substrate 30, on which the organic semiconductor layer 20 is formed, is heated on a hot plate, for example, of 140° C. to carry out thermal treatment for about 10 minutes. This permits oxygen dissolved in the organic semiconductor ink to be removed from the organic semiconductor layer 20, so that an excess of impurity charges ascribed to the oxygen is prevented from being left. Eventually, conductivity of the organic semiconductor layer 20 lowers, enabling an off current of the resulting thin film transistor to be reduced. According to the thermal treatment, the solvent left in the organic semiconductor layer 20 is reliably removed.

The thermal treatment is preferably carried out under such temperature and time conditions that allow efficient removal of oxygen and do not facilitate degradation of the organic semiconductor layer 20, and such conditions are appropriately determined depending on the type of material for the organic semiconductor layer 20. P3HT is used herein as the organic semiconductor layer 20. Because P3HT exhibits the highest mobility when undergoing thermal treatment at 80° C. and its degradation is facilitated when the temperature exceeds 180° C., the thermal treatment is carried out herein at a temperature of from 80° C. to 160° C. for a time of several minutes to about one hour.

It is to be noted that although it is stated that the thermal treatment is carried out on a hot plate, a heat source is not limited to this and the heat treatment may be effected by irradiation of light such as laser irradiation or by hot air drying or in a dry reduced pressure atmosphere.

Figure 1C:
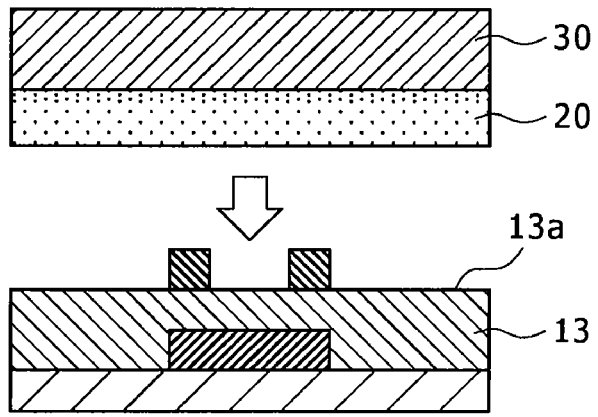
Figure 1D:
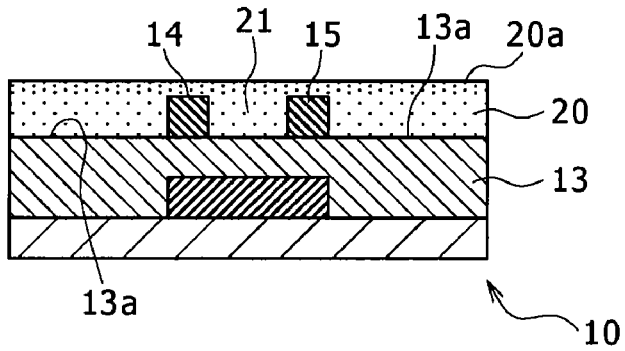

Thereafter, as shown in FIG. 1C, the stamp substrate 30 is pressed at a side, on which the organic semiconductor layer 20 is formed, against the surface 13a of the gate insulating film 13 of the substrate 10 to be transferred. Since the organic semiconductor layer 20 made of PDMS is high in adhesion to a face whose water repellency is small, adhesion of the organic semiconductor layer 14 to the surface of gate insulating film 13 made of $SiO_2$ is higher than adhesion to the water-repellent face 30a of the stamp substrate 30 made of PDMS. For this reason, as shown in FIG. 1D, the organic semiconductor layer 20 is transferred on the entire region of the surface 13a of the gate insulating film 13 while covering the source electrode 14 and the drain electrode 15. In this way, a channel layer 21 made of the organic semiconductor layer 20 is formed between the source electrode 14 and the drain electrode 15, and the contact face 20a of the organic semiconductor layer 20, which is in contact with the water-repellent surface 30a upon the crystallization, is disposed at a side opposite to the gate insulating film 13. In a manner as stated above, a thin film transistor is fabricated.

Figure 2:
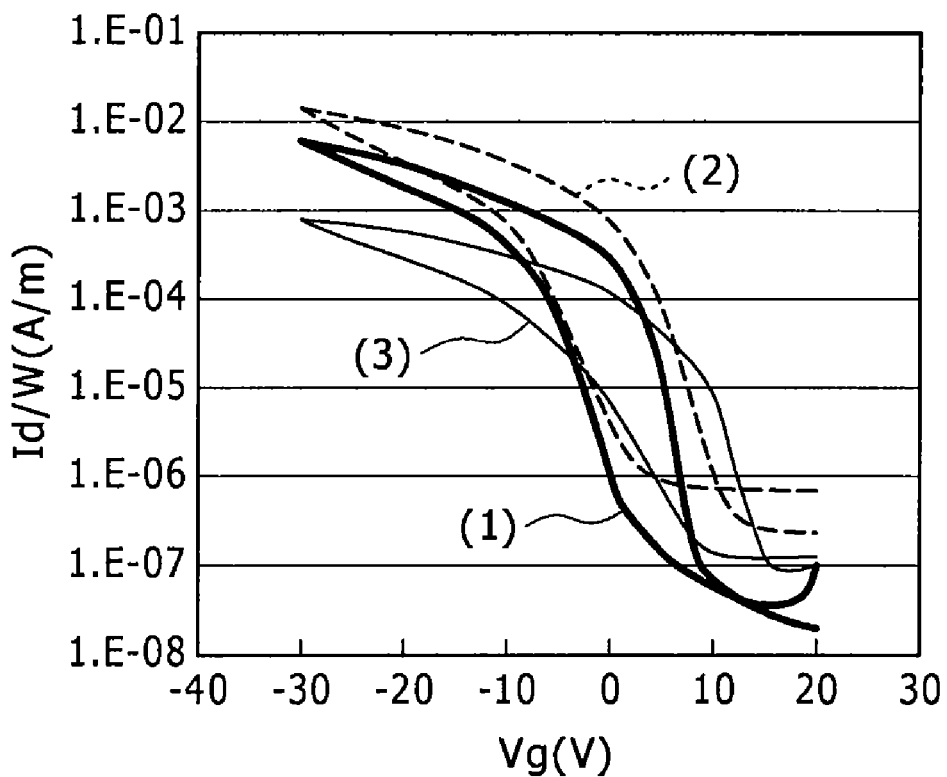
FIG. 2 is a graph showing the relation between a gate voltage and a drain current of a thin film transistor obtained by the method of the first embodiment.

FIG. 2 shows the results of measurement of gate voltage ($V_g$)/drain current ($I_d$) of the thin film transistor of the first embodiment.

In the figure, graph (1) shows the results of measurement of a thin film transistor. The organic semiconductor layer 20 made of P3HT is formed by a dry stamping method in a manner as in the first embodiment. Graph (2) shows the results of measurement of a thin film transistor formed by the manufacturing method of the first embodiment but without carrying out the thermal treatment of the organic semiconductor layer 20. Moreover, graph (3) shows the results of measurement of a thin film transistor. The organic semiconductor layer made of P3HT is formed by a spin coating method without a water-repellent treatment on the surface of the gate insulating film.

It will be noted that the respective thin film transistors used are formed as follows. A low resistance silicon substrate doped with an impurity at a high concentration is used as a gate electrode 12, and the gate electrode 12 is subjected to thermal oxidation treatment on the surface thereof to form a gate insulating film 13 made of $SiO_2$. The gate insulating film 13 is formed thereon with a source electrode 14 and a drain electrode 15, each made of gold (Au) and chromium (Cr) stacked in this order. In addition, each transistor is set at gate length/gate width (L/W)=5 μm/47.2 mm and becomes an on state when applied with a minus gate voltage (of about −30 V). The measurement of a drain current value has been monitored while continuously shifting the gate voltage in minus direction and also in plus direction.

From the results of the measurement shown in graphs (1) to (3) of FIG. 2, it has been confirmed that the thin film transistor made by the dry stamping method (1) (including the thermal treatment) increases a drain current value in an on state over the thin film transistor made by the spin coating method (3). It has also been confirmed that with the thin film transistor (1) to which the invention has been applied, the drain current value in an on/off state is reduced over the case of the thin film transistor (2) made by the dry stamping method (2) (including no thermal treatment). It has been confirmed that the on/off ratio of the thin film transistor of (1) is at $10^5$, which is greater by not less than one order of magnitude than those on/off ratios of the thin film transistors of (2) and (3). It is to be noted that with the thin film transistor of (2), the off current increases along with an increasing on current when compared with those of the thin film transistor of (3). Nevertheless, because an increasing ratio of the off current relative to an increase of the on current is small, the thin film transistor of (2) has an increasing on/off ratio when compared with the thin film transistor of (3).

Although not particularly shown in the drawings, it has been confirmed that the thin film transistors of (1) and (2) made by the dry stamping methods are improved in mobility by not less than one order of magnitude over the thin film transistor of (3).

As stated hereinabove, according to the thin film transistors of this embodiment, it has been confirmed that not only the on current increases, but also the off current decreases, so that the on/off ratio increases. This eventually leads to an improvement in electric characteristics of the semiconductor device.

Since the thermal treatment of the organic semiconductor layer 20 is carried out on the stamp substrate 30 made of PDMS, no thermal treatment is necessary on the substrate 10 to be transferred. This makes it possible to use a plastic substrate or the like of low heat resistance as the underlying substrate 11 for the substrate 10 to be transferred.

Figure 3:
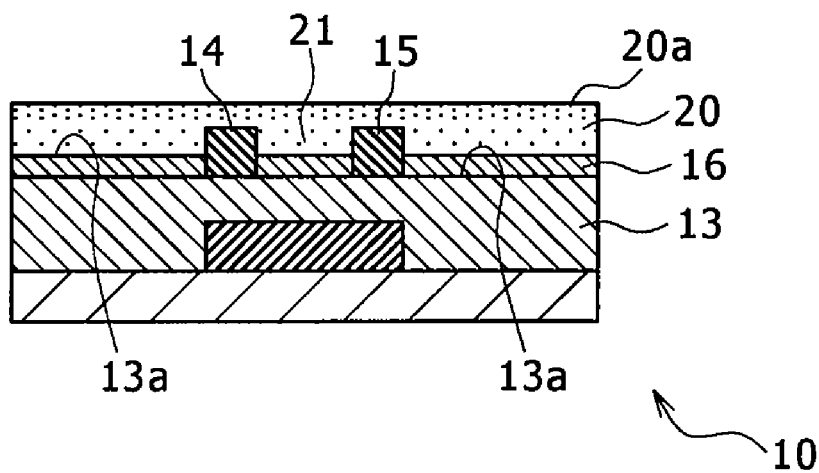
FIG. 3 is a schematic sectional view illustrating a modification of the first embodiment.

In the above first embodiment, as shown in FIG. 3, the gate insulating film 13 may be subjected to water-repellent treatment on the surface thereof by immersing the substrate 10 having the source electrode 14 and the drain electrode 15 in a solution dissolving octadecytrichlorosilane (OTS) in toluene at a concentration of 1 mM. In this case, a water-repellent layer 16 is formed on the surface 13a of the gate insulating film 13, and a surface 16a of the water-repellent layer 16 serves as a face to be transferred of the organic semiconductor layer in the substrate 10 to be transferred.

It will also be noted that although the gate insulating film 13 has been subjected to the water-repellent treatment on the surface thereof after the formation of the source electrode 14/drain electrode 15 herein, the water-repellent treatment may be effected prior to the formation of the source electrode 14/drain electrode 15.

Next, in the same manner as in the first embodiment, an organic semiconductor layer 20 is formed on a water-repellent surface 30a (see FIG. 1B) of a stamp substrate 30 (see FIG. 1B) and is thermally treated, after which the stamp substrate 30 is pressed against the surface 16a of the water-repellent layer 16 of the substrate 10 to be transferred at a side where the organic semiconductor layer 20 is formed. Because the surface 16a of the substrate 10 to be transferred, which has been treated with 1 mM of OTS, is lower in water repellency than the water-repellent face 30a of the stamp substrate 30 made of PDMS and is better in adhesion to the organic semiconductor layer 20 made of P3HT, the organic semiconductor layer 20 is transferred to the surface 16a of the substrate 10 to be transferred. In this case, like the first embodiment, the contact face 20a of the organic semiconductor layer 20 kept in contact with the water-repellent surface 20 is disposed at a side opposite to the gate insulating film 13 upon crystallization. In this way, a thin film transistor is fabricated.

Although not shown in the drawings, it has been confirmed that according to the thin film transistor of Modification 1, the contact face 20a of the organic semiconductor layer 20 in contact with the water-repellent surface 30a is disposed at a side opposite to the gate insulating film 13, and the face of the organic semiconductor layer 20 at the side of the substrate 10 to be transferred is in contact with the water-repellent layer 16. Therefore, the on current increases by not less than one order of magnitude over the case of the thin film transistor of the first embodiment (see graph (1) in FIG. 2), along with a further increase in on/off ratio.

Figure 4A:
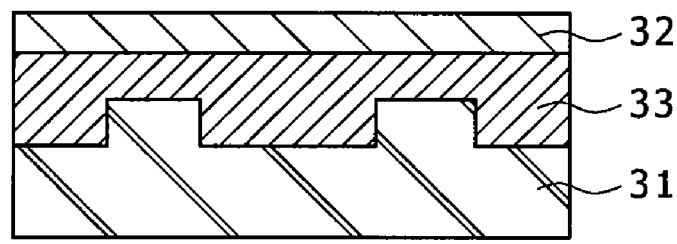
FIGS. 4A to 4C are, respectively, a schematic sectional view showing a manufacturing step illustrating a method for manufacturing a semiconductor device according to a second embodiment.
Figure 4B:
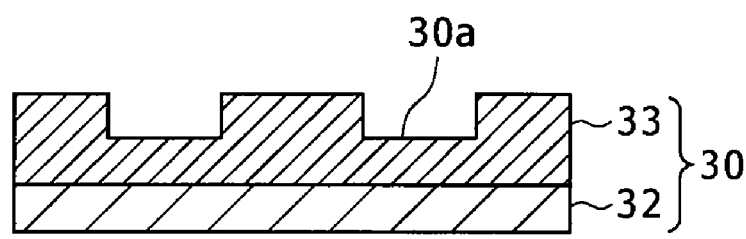
Figure 4C:
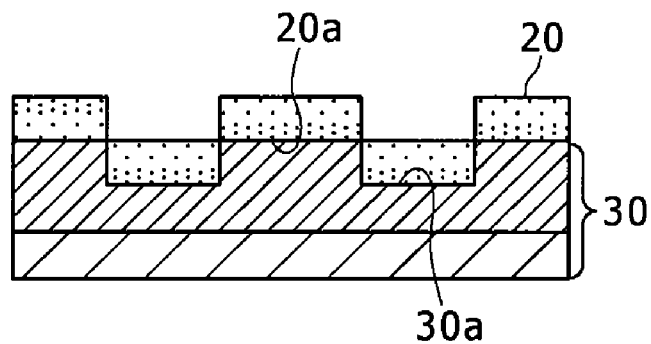

An instance of a manufacturing method of a semiconductor device according to a second embodiment is illustrated with reference to FIGS. 4A to 4C showing a sectional view of a manufacturing step. It will be noted that the substrate 10 to be transferred has the same arrangement as in the first embodiment.

Initially, a stamp substrate is made. More particularly, as shown in FIG. 4A, PDMS having water-repellency is poured between a quartz substrate (master) 31 provided with an indented pattern on a surface thereof and a glass substrate serving as a support substrate 32 of a stamp substrate described hereinafter, followed by application of heat for curing. In this manner, a stamp unit 33 made of PDMS and transferred, in reverse manner, with the indented pattern on the surface of the quartz substrate 31 is formed.

As shown in FIG. 4B, the stamp unit 33 is separated from the quartz substrate 31 (see FIG. 1A), thereby completing a stamp substrate 30 composed of the stamp unit 33 and the quartz substrate 31. This stamp substrate 30 has a water-repellent surface 30a provided with the indented pattern.

Next, as shown in FIG. 4C, the stamp substrate 30 is immersed in an organic semiconductor ink dissolving an organic semiconductor material made, for example, of P3HT in chloroform at a concentration of 5 mg/ml. Thereafter, the stamp substrate 30 is pulled up from the organic semiconductor ink, for which the organic semiconductor ink is coated on the water-repellent surface 30a according to the indented pattern. The coating of the organic semiconductor ink onto the stamp substrate 30 having the indented pattern on the surface side by the immersion method enables the organic semiconductor ink to be applied in a more uniform thickness than with the case of coating by a spin coating method, and is thus preferred.

It will be noted that chloroform is low in boiling point and high volatility, so that the organic semiconductor ink is dried by evaporation of chloroform immediately after the pulling up of the stamp substrate 30, thereby providing a thin film. The organic semiconductor material is crystallized in such a state that one main surface side is in contact with the water-repellent surface 30a and the organic semiconductor layer 20 is formed on the water-repellent surface 30a. The face in contact with the water-repellent surface 30a upon crystallization is defined as a contact surface 20a of the organic semiconductor layer 20.

Next, in the same manner as in the first embodiment, the stamp substrate 30 formed with the organic semiconductor layer 20 is heated, for example, on a hot plate of 140° C. for carrying out a thermal treatment for about 10 minutes. This treatment allows oxygen dissolved in the organic semiconductor ink to be removed from the organic semiconductor layer 20, thereby preventing impurity charges owing to the oxygen from being left in excess. As a result, conductivity of the organic semiconductor layer 20 lowers, and the off current of the resulting thin film transistor can be reduced.

Figure 4D:
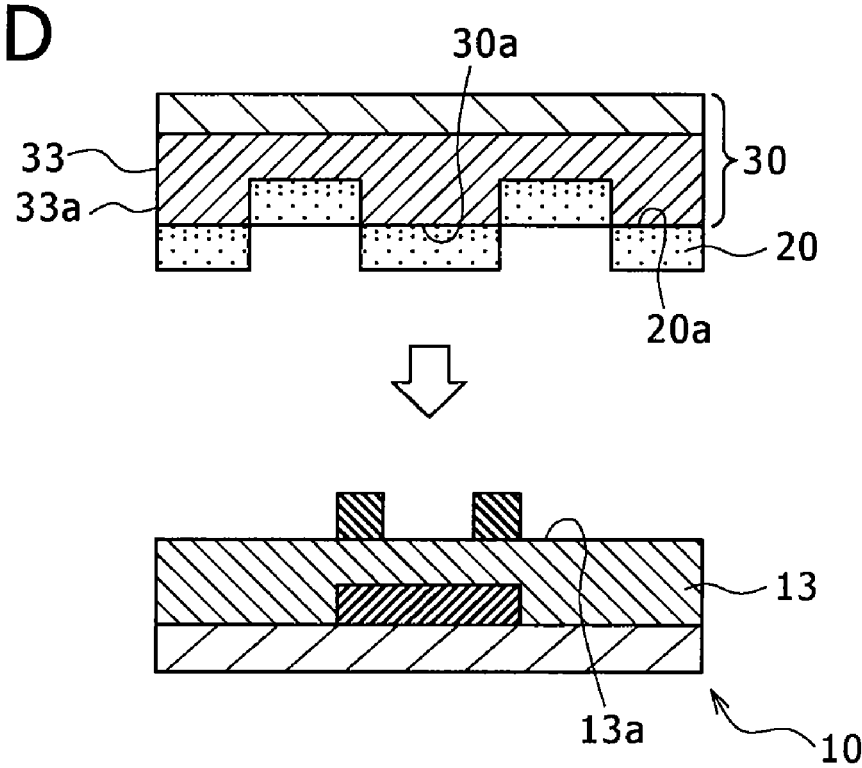
FIGS. 4D and 4E are, respectively, a schematic sectional view showing a manufacturing step subsequent to FIG. 4C.
Figure 4E:
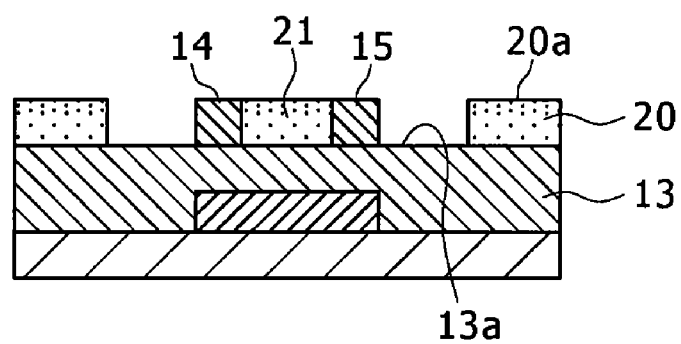

Next, as shown in FIG. 4D, the side of the stamp substrate 30 where the organic semiconductor layer 20 is formed is pressed against the surface 13a of the gate insulating film 13 serving as a face to be transferred of the substrate 10 formed in the same manner as in the first embodiment. The organic semiconductor layer 20 made of P3HT is high in adhesion to the surface 13a of the gate insulating film 13 that is lower in water repellency than the stamp substrate 30, and protrusions 33a of the stamp unit 33 are strongly pressed against the surface 13a of the gate insulating film 13. As a result, as shown in FIG. 4E, the pattern of the organic semiconductor layer 20 provided at the top faces of the protrusions 33a (see FIG. 4D) is transferred between the source electrode 14 and the drain electrode 15 on the surface 13a of the gate insulating film 13. To this end, it is preferred that in order to reliably bury the pattern of the organic semiconductor layer 20 provided at the top faces of the protrusions between the source electrode 14 and the drain electrode 15, the width of the protrusion 33a of the stamp substrate 20 is formed beforehand to allow for a given margin.

In a manner as stated hereinabove, a thin film transistor is fabricated. The channel layer 21 made of the organic semiconductor layer 20 is patterned between the source electrode 14 and the drain electrode 15. With this thin film transistor, the contact surface 20a of the organic semiconductor layer 20 in contact with the water-repellent surface 30a is disposed at a side opposite to the gate insulating film 13 upon crystallization.

According to such a manufacturing method of a semiconductor device, the organic semiconductor layer 20 formed on the stamp substrate 30 is thermally treated, oxygen dissolved in the organic semiconductor ink is removed from the organic semiconductor layer 20. This prevents impurity charges, ascribed to oxygen in the organic semiconductor layer 20, from being left in excess. Thus, the organic semiconductor layer 20 lowers in conductivity along with an off current being reduced. Moreover, the pattern of the organic semiconductor layer 20 provided at the top faces of the protrusions 33a of the stamp substrate 30 is transferred to the surface 13a of the gate insulating film 13 that is better in adhesion to the organic semiconductor layer 20 than to the stamp substrate 30, so that the organic semiconductor layer 20 is pattered in high accuracy. This permits accurate patterning of the channel layer 21 made of the organic semiconductor layer 20 between the source electrode 14 and the drain electrode 15, thereby preventing mutual communication of the organic semiconductor layers between adjacent devices. The off current is reduced as well.

Since the contact surface 20a of the organic semiconductor layer 20 in contact with the water-repellent surface 30a is disposed at a side opposite to the gate insulating film 13 upon crystallization, the on current can be increased, like the thin film transistor of the first embodiment.

Accordingly, an on/off ratio of the thin film transistor can be increased, thereby improving the electric characteristics of the semiconductor device.

Since the organic semiconductor layer 20 is thermally treated on the stamp substrate 30, no thermal treatment over the substrate 10 to be transferred is necessary. This allows the use of a plastic substrate or the like of low heat resistance as the underlying substrate of the substrate 10 to be transferred.

It will be noted that although the instance where no water-repellent treatment is carried out on the surface 13a of the gate insulating film 13 has been illustrated, a water-repellent treatment may be carried out. In this case, because the organic semiconductor layer 20 is formed on the gate insulating film 13 through a water-repellent layer, it may be expected to attain a further increase in on/off ratio.

An instance of a manufacturing method of a semiconductor device according to a third embodiment of the invention is illustrated with reference to FIGS. 5A to 5G showing a sectional view of a manufacturing step, respectively. In the figures, like members or parts as in the first embodiment are indicated by like reference numerals, respectively.

Figure 5A:
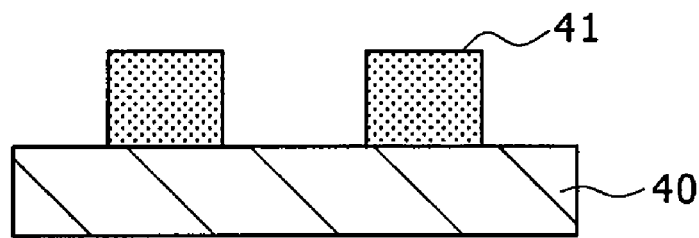
FIGS. 5A to 5D are, respectively, a schematic sectional view showing a manufacturing step illustrating a method for manufacturing a semiconductor device according to a third embodiment.

Initially, a transfer substrate is made. More particularly, as shown in FIG. 5A, a resist (not shown) is coated onto a hydrophilic transfer substrate 40 made of $SiO_2$ and a resist pattern 41 is formed according to an ordinary lithographic technique.

Figure 5B:
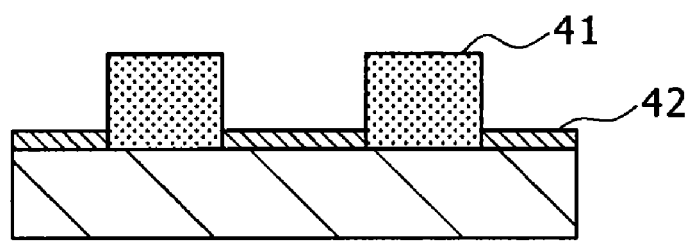

Next, as shown in FIG. 5B, the transfer substrate 40 provided with the resist pattern 41 is immersed in a toluene solution of 10 mM of OTS to subject the surface of the transfer substrate 40 to water-repellent treatment, followed by drying to form a water-repellent pattern 42 on the surface of the transfer substrate 40 where exposed out of the resist pattern 41. It will be noted that although it has been stated that the water-repellent treatment is carried out using OTS, the water-repellent treatment may be performed by use of a fluorine-containing silane coupler having higher water repellency.

Figure 5C:
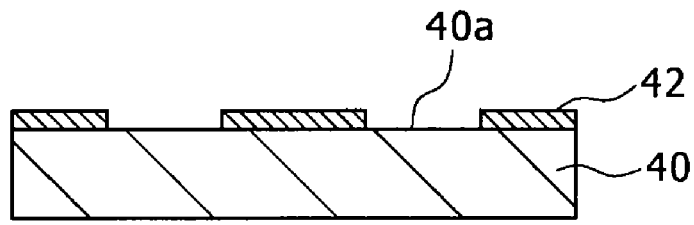

Thereafter, as shown in FIG. 5C, the resist pattern 41 (see FIG. 5B) is removed. At this stage, the transfer substrate 40 is in such a state that the surface is formed thereon with a hydrophilic pattern 40a, in which the surface of the hydrophilic transfer substrate 40 is exposed, and also with a water-repellent pattern 42 (treated pattern).

Figure 5D:
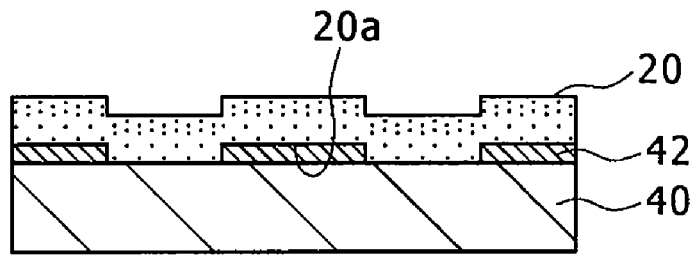

Next, as shown in FIG. 5D, an organic semiconductor ink dissolving 5 mM of an organic semiconductor material made of P3HT in chloroform is coated onto the transfer substrate 40, for example, by a spin coating method, and dried to form a thin film. The organic semiconductor material is crystallized in a state of partial contact with the water-repellent pattern 42, and the organic semiconductor layer 20 is formed on the surface of the transfer substrate 40. A region of the organic semiconductor layer 20 in contact with the water-repellent pattern 42 upon the crystallization is defined as a contact face 20a.

It will be noted that although it has been illustrated that the organic semiconductor layer is coated by a spin coating method, the organic semiconductor ink may be coated onto the transfer substrate 40 by an immersion method. This method is preferred because the organic semiconductor ink can be coated in a more uniform thickness than with the case of coating by a spin coating method.

Next, like the first embodiment, the transfer substrate 40 formed with the organic semiconductor layer 20 thereon is heated, for example, on a hot plate set at 140° C. for carrying out a thermal treatment for about 10 minutes. This allows oxygen dissolved in the organic semiconductor ink to be removed from the resulting organic semiconductor layer 20. Thus, impurity charges ascribed to the oxygen are prevented from being left in excess. Thus, conductivity of the organic semiconductor layer 20 lowers, making it possible to reduce the off current of the resulting thin film transistor.

Figure 5E:
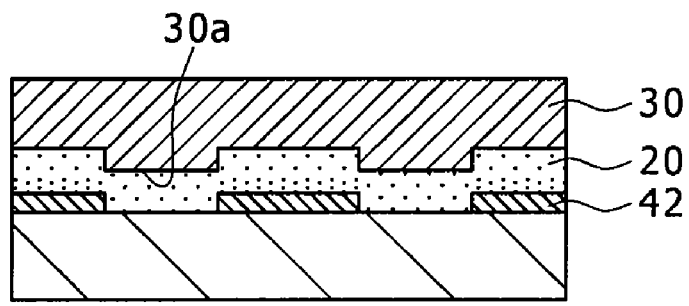
FIGS. 5E to 5G are, respectively, a schematic sectional view showing a manufacturing step subsequent to FIG. 5D.
Figure 5F:
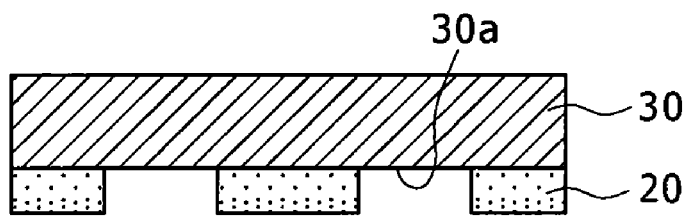
Figure 5G:
Figure 5G:
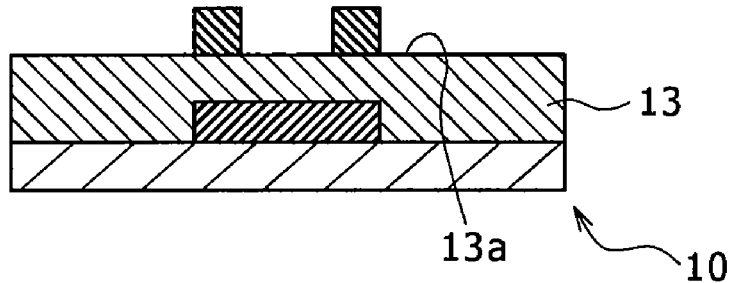
Figure 5G:
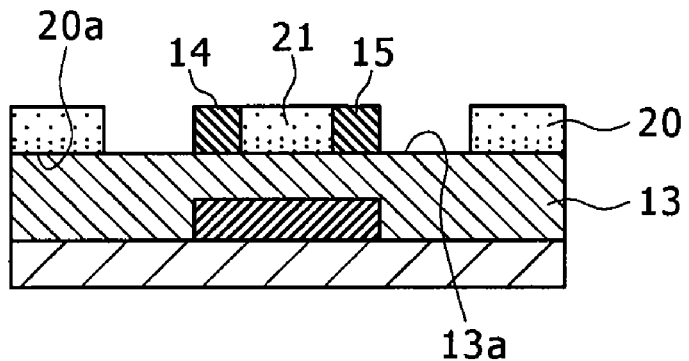
Figure 6:
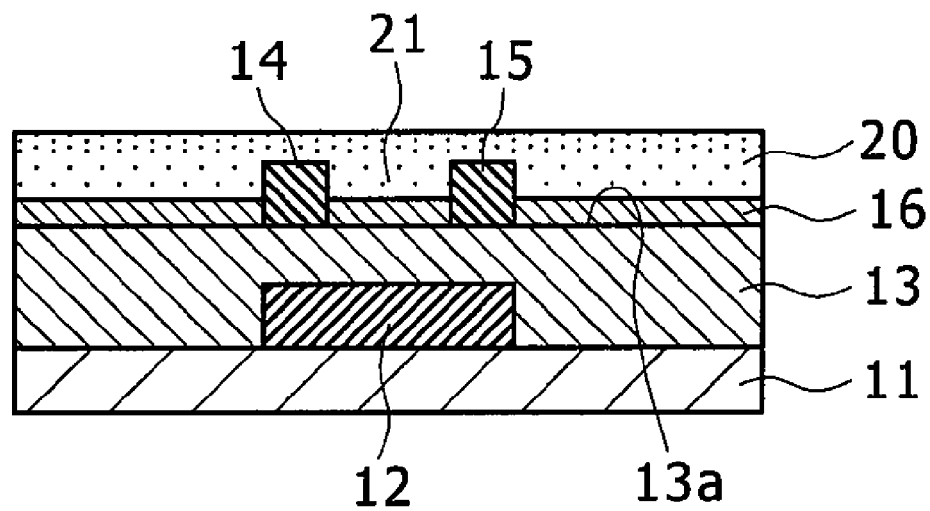
FIG. 6 is a schematic sectional view illustrating a prior-art method of manufacturing a semiconductor device.
Figure 7A:
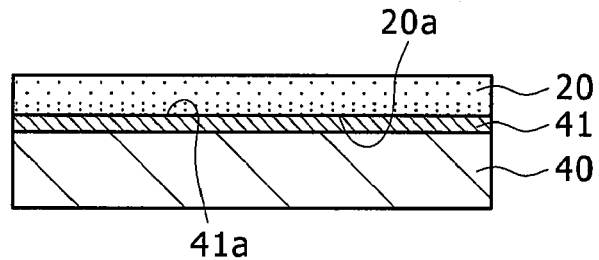
FIGS. 7A to 7D are, respectively, a schematic sectional view showing a manufacturing step illustrating a prior-art method of manufacturing a semiconductor device.
Figure 7B:
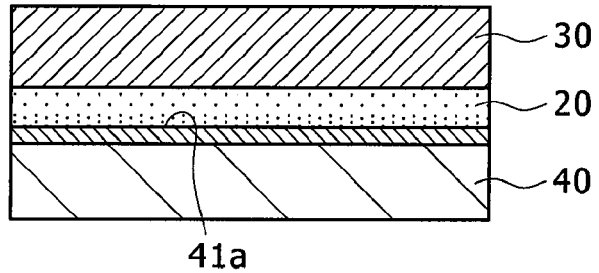
Figure 7C:
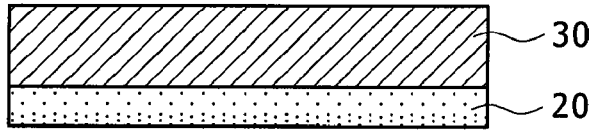
Figure 7D:
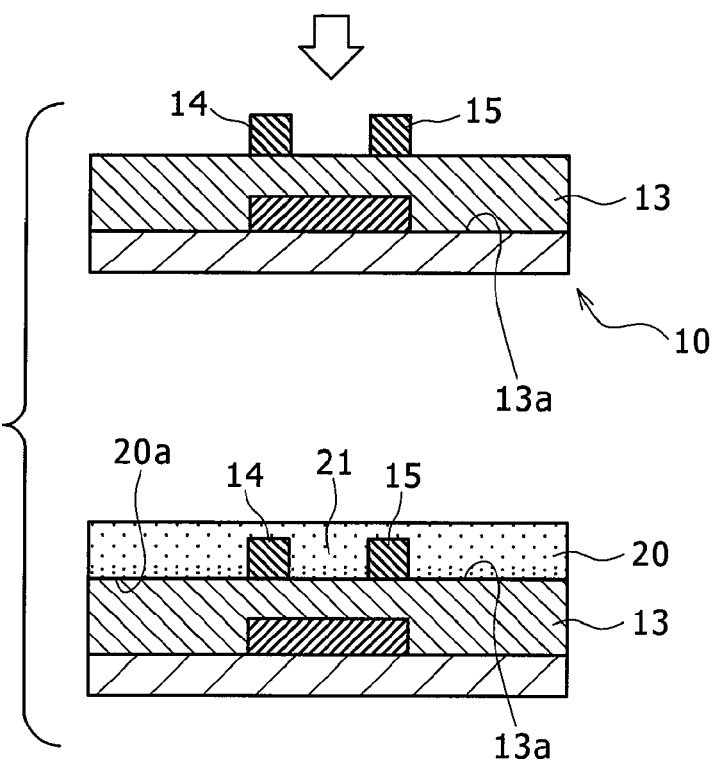

Subsequently, as shown in FIG. 4E, the surface (water-repellent surface 30a) of a flat plate stamp substrate 30 obtained, for example, by curing water-repellent PDMS is pressed against a side where the organic semiconductor layer 20 of the transfer substrate 40 is formed. Upon the pressing, the water-repellent surface 30a of the stamp substrate 30 is so deformed as to be in contact with the entire region of the organic semiconductor layer 20. Because the organic semiconductor layer 20 made of P3HT is high in adhesion to a face whose water repellency is low, the stamp substrate 30 is so arranged as to be lower in water repellency than the water-repellency pattern 42 and to be higher in water repellency than the hydrophilic pattern 40a. Hence, the stamp substrate 30 becomes better in adhesion to the organic semiconductor layer 20 than to the water-repellent pattern 42 and lower in adhesion to the organic semiconductor layer 20 than to the hydrophilic pattern 40a. As a result, as shown in FIG. 5F, the pattern of the organic semiconductor layer 20 on the water-repellent pattern 42 (see FIG. 5E) of the transfer substrate 40 (see FIG. 5E) is transferred to the water-repellent surface 30a of the stamp substrate 30.

Next, the stamp substrate 30 is pressed at a side of the surface, on which the pattern of the organic semiconductor of the stamp substrate 30 is formed, against the surface 13a of the gate insulating film 13 of the substrate 10 to be transferred, which has the same arrangement as in the first embodiment. Because the surface 13a of the gate insulating film 13 serving as a face of the substrate 10 to be transferred is higher in adhesion to the organic semiconductor layer 20 than the stamp substrate 30, the pattern of the organic semiconductor substrate 20 is transferred between the source electrode 14 and the drain electrode 15 as is particularly shown in FIG. 5G. In this way, the channel layer 21 made of the organic semiconductor layer 20 is formed. In this connection, it is preferred that in order to reliably bury the pattern of the organic semiconductor layer 20 between the source electrode 14 and the drain electrode 15, the width of the water-repellent pattern 42 of the transfer substrate 40 illustrated with reference to FIG. 5A is formed to allow for a margin.

In a manner as having stated hereinabove, a thin film transistor is fabricated, in which the channel layer 21 made of the organic semiconductor layer 20 is formed in a pattern between the source electrode 14 and the drain electrode 15. With this thin film transistor, the contact face 20a of the organic semiconductor layer 20 in contact with the water-repellent pattern 42 is disposed at a side of the gate insulating film 13 upon crystallization.

According to the manufacturing method of the semiconductor device, since the organic semiconductor layer 20 formed on the transfer substrate 40 is thermally treated, oxygen dissolved in the organic semiconductor ink is removed from the organic semiconductor layer 20. This eventually prevents impurity charges, ascribed to the oxygen in the organic semiconductor layer 20, from being left in excess, thus leading to a lowering in conductivity of the organic semiconductor layer 20 and a reduction in an off current. Like the second embodiment, the channel layer 21 made of the organic semiconductor layer 20 can be patterned in high accuracy between the source electrode 14 and the drain electrode 15. This prevents mutual communication, which contributes to reduction of the off current, of the organic semiconductor layers 20 between adjacent devices.

The contact surface 20a of the organic semiconductor layer 20 in contact with the water-repellent pattern 42 is disposed at the side of the gate insulating film 13 upon crystallization, so that an on current increases over the case where the organic semiconductor layer is coated and formed by a spin coating method.

This leads to an increased on/off ratio of the resulting semiconductor device, thereby enabling the semiconductor device to be improved in electric characteristics.

Since the organic semiconductor layer 20 is thermally treated on the transfer substrate 40, no thermal treatment over the substrate 10 to be transferred is necessary. This allows the possible use of a plastic substrate or the like of low heat resistance as the underlying substrate 11 of the substrate 10 to be transferred.

It will be noted that although the instance where no water-repellent treatment is carried out on the surface 13a of the gate insulating film 13 has been illustrated, a water-repellent treatment may be carried out. In this case, because the organic semiconductor layer 20 is formed on the gate insulating film 13 through a water-repellent layer, it may be expected to attain a further increase in on/off ratio.

In this embodiment, although the instance where the organic semiconductor layer 20 formed on the transfer substrate 40 is thermally treated has been illustrated as set out with reference to FIG. 5D, the thermal treatment may be effected on the organic semiconductor layer 20 obtained after transfer on the stamp substrate 30 as illustrated with reference to FIG. 5E. In this case, similar results are obtained.

In the first to third embodiments described hereinabove, the bottom gate/bottom contact thin film transistors have been illustrated, which should not be construed as limiting the invention thereto. For instance, the invention is also applicable to top gate/bottom contact, bottom gate/top contact, and top gate/top contact thin film transistors.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for manufacturing a thin film transistor comprising the steps of:
   (1) coating a solution containing an organic semiconductor material on a water-repellent surface of a water-repellent stamp substrate;
   (2) drying the thus coated organic semiconductor material-containing solution on the water-repellent surface to crystallize the organic semiconductor material in contact with the water-repellent surface, thereby forming a semiconductor layer;
   (3) thermally treating said semiconductor layer formed on said stamp substrate; and (4) pressing said stamp substrate at a side, in which the thermally treated organic semiconductor layer is formed, against a surface of a substrate to be transferred so that said organic semiconductor layer is transferred to the surface of said substrate to be transferred, wherein the substrate to be transferred is included in the thin film transistor, and wherein the organic semiconductor layer forms a channel layer of the thin film transistor.

2. The method for manufacturing the thin film transistor according to claim 1, wherein said substrate to be transferred includes a gate insulating film formed on said substrate through a gate electrode, a source electrode and a drain electrode are formed on said gate insulating film prior to or after the step (4), and said organic semiconductor layer is transferred to a surface of said insulating film in the step (4) so that the channel layer made of said organic semiconductor layer is formed between said source electrode and said drain electrode.

3. The method for manufacturing the thin film transistor according to claim 1, wherein prior to the step (4), said substrate to be transferred is subjected to water-repellent treatment on the surface thereof.

4. The method for manufacturing the thin film transistor according to claim 1, wherein the substrate to be transferred comprises an underlying plastic substrate.

5. The method for manufacturing the thin film transistor according to claim 1, wherein the organic semiconductor layer is an organic semiconductor ink comprising a material selected from the group consisting of: poly-3-hexylthiophene and fluorine-dithiophene copolymer.

6. A method for manufacturing a thin film transistor comprising the steps of:

(1) providing a stamp substrate having an indented surface and coating a solution containing an organic semiconductor material onto the indented surface according to an indented pattern thereof;

(2) drying the organic semiconductor material-containing solution coated on the surface of said stamp substrate to crystallize the organic semiconductor material, thereby forming an organic semiconductor layer;

(3) thermally treating said organic semiconductor layer formed on said stamp substrate; and (4) pressing said stamp substrate at a side where the thermally treated organic semiconductor layer is formed against a surface of a substrate to be transferred and separating said stamp substrate from the organic semiconductor layer in contact with the surface of said substrate to be transferred, thereby causing the pattern of said organic semiconductor layer formed at top faces of protrusions to be transferred to the surface of said substrate to be transferred, wherein the substrate to be transferred is included in the thin film transistor.

7. The method for manufacturing the thin film transistor according to claim 6, wherein a source electrode and a drain electrode are formed on the surface of said substrate to be transferred, and when the pattern of said organic semiconductor layer is transferred to the surface of said substrate to be transferred in the step (4), a channel layer made of said organic semiconductor layer is formed between said source electrode and said drain electrode.

8. The method for manufacturing the thin film transistor according to claim 6, wherein the surface of said stamp substrate has water repellency, and in the step (2), said organic semiconductor layer is crystallized in a state of contact with the water-repellent surface of said stamp substrate.

9. The method for manufacturing the thin film transistor according to claim 6, wherein the surface of said substrate to be transferred is subjected to water-repellent treatment prior to the step (4).

10. The method for manufacturing the thin film transistor according to claim 6, wherein said stamp substrate is immersed in the solution containing said organic semiconductor material in the step (1).

11. The method for manufacturing the thin film transistor according to claim 6, wherein the substrate to be transferred comprises an underlying plastic substrate.

12. The method for manufacturing the thin film transistor according to claim 6, wherein the organic semiconductor layer is an organic semiconductor ink comprising a material selected from the group consisting of: poly-3-hexylthiophene and fluorine-dithiophene copolymer.

* * * * *